(12) United States Patent
Jiang et al.

(10) Patent No.: US 7,037,808 B2
(45) Date of Patent: May 2, 2006

(54) METHOD OF FORMING SEMICONDUCTOR CONSTRUCTIONS

(75) Inventors: Tongbi Jiang, Boise, ID (US); Zhiping Yin, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 11/197,151

(22) Filed: Aug. 3, 2005

(65) Prior Publication Data

US 2005/0285256 A1 Dec. 29, 2005

Related U.S. Application Data

(62) Division of application No. 10/879,372, filed on Jun. 28, 2004.

(51) Int. Cl.
*H01L 21/322* (2006.01)
(52) U.S. Cl. .......................... 438/476; 257/471
(58) Field of Classification Search ............... 438/473, 438/474, 476, 471
See application file for complete search history.

(56) References Cited

U.S. PATENT DOCUMENTS

| 655,440 | A | * | 8/1900 | Redington ............... 192/35 |
|---|---|---|---|---|
| 3,698,078 | A | * | 10/1972 | Redington ............... 438/73 |
| 4,234,352 | A | * | 11/1980 | Swanson ............... 136/253 |
| 4,568,565 | A | | 2/1986 | Gupta et al. |
| 4,612,408 | A | * | 9/1986 | Moddel et al. ............. 136/244 |
| 4,971,655 | A | | 11/1990 | Stefano et al. |
| 5,223,734 | A | | 6/1993 | Lowrey et al. |
| 5,236,854 | A | * | 8/1993 | Higaki ............... 438/167 |
| 5,240,739 | A | | 8/1993 | Doan et al. |
| 5,283,459 | A | * | 2/1994 | Hirano et al. ............... 257/419 |
| 5,376,405 | A | | 12/1994 | Doan et al. |
| 5,494,849 | A | * | 2/1996 | Iyer et al. ............... 438/459 |
| 5,773,152 | A | * | 6/1998 | Okonogi ............... 428/446 |
| 5,997,634 | A | | 12/1999 | Sandhu et al. |
| 6,255,195 | B1 | * | 7/2001 | Linn et al. ............... 438/455 |
| 6,531,378 | B1 | * | 3/2003 | Hopfner ............... 438/473 |
| 6,541,348 | B1 | * | 4/2003 | Nakajima ............... 438/407 |
| 6,555,440 | B1 | | 4/2003 | Geefay |
| 6,812,064 | B1 | | 11/2004 | Jiang et al. |
| 6,825,532 | B1 | * | 11/2004 | Linn et al. ............... 257/347 |

OTHER PUBLICATIONS

Ilderem, V., et al., "Optimized Deposition Parameters For Low Pressure Chemical Vapor Deposited Titanium Silicide", *Massachusetts Institute of Technology*, vol. 135, No. 10, pp. 2590-2596 (Feb. 1988).

(Continued)

*Primary Examiner*—S. V. Clark
(74) *Attorney, Agent, or Firm*—Wells St. John P.S.

(57) ABSTRACT

The invention includes a semiconductor construction. The construction has a semiconductor material die with a front surface, a back surface in opposing relation to the front surface, and a thickness of less than 400 microns between the front and back surfaces. The construction also has circuitry associated with the die and over the front surface of the die, and a layer touching the back surface of the die. The layer can correspond to getter-inducing material and/or to a stress-inducing material. The layer can have a composition which includes silicon dioxide and/or silicon nitride. The composition can include one or more hydrogen isotopes, and the hydrogen isotopes can have a higher abundance of deuterium than the natural abundance of deuterium.

17 Claims, 4 Drawing Sheets

OTHER PUBLICATIONS

Nagabushnam, R.V., et al., "Kinetics And Mechanism Of The C49 to C54 Titanium Disilicide Phase Transformation Formation In Nitrogen Ambient", 5 Pages (Nov. 1995).

"Hitachi Investigates Wafer-Backside Copper Contamination"; Peters, Laura; www.e-insite.net/semiconductor/index.asp?layout=articlePrint&articleID=CA267266; May 28, 2003; 1 pp.

"15.1 Gettering of Transition Metals in c-SI: Gettering in Silicon Technology"; Hieslmaier, H.; Gettering, Chapter 15; Jun. 1998; pp. 777-808.

"Post-Epitaxial Polysilicon and $Si_3 N_4$ Gettering in Silicon"; Chen, M.C. et al.; Polysilicon J. Electrochem Soc. Solid-State Science and Technology, vol. 129, No6; Jun. 1982; pp. 1295-1299.

* cited by examiner

METHOD OF FORMING SEMICONDUCTOR CONSTRUCTIONS

RELATED PATENT DATA

This patent resulted from a divisional application of U.S. patent application Ser. No. 10/879,372, filed Jun. 28, 2004, and hereby incorporated by reference.

TECHNICAL FIELD

The invention pertains to semiconductor constructions and methods of forming semiconductor constructions.

BACKGROUND OF THE INVENTION

Numerous applications are known for semiconductor constructions, and new applications are being developed. Semiconductor constructions can be utilized in, for example, mobile devices, such as, for example, cell phones and other small personal telephones, cameras and personal calendars. It is a continuing goal to make the portable electronic devices smaller and more lightweight, and accordingly it is a continuing goal to reduce the size of semiconductor constructions utilized in the devices while maintaining desired performance characteristics of the constructions.

Typical semiconductor constructions have a die of semiconductor material serving as a base for the constructions. Integrated circuitry is formed to be supported by the die. Such circuitry can comprise portions formed over the die, as well as portions extending within the die (for example, diffusion regions). An exemplary semiconductor die is a silicon-containing material. Such material can comprise, consist essentially of, or consist of silicon lightly doped with appropriate background-type dopant. The die can be referred to as a substrate in some aspects of this disclosure. To aid in interpretation of the claims that follow, the terms "semiconductive substrate" and "semiconductor substrate" are defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

One method which has been utilized to reduce the size of semiconductor constructions is to reduce the thicknesses of the semiconductor dies utilized in such constructions. Each die utilized in a semiconductor construction will typically have a front surface configured for supporting integrated circuitry thereon, and a back surface in opposing relation to the front surface. The die are thinned by removing material from the back surface until a desired thickness of the resulting die is achieved. Such removal can be accomplished by first subjecting the die to a coarse roughening to remove the majority of the material, and subsequently removing the remainder of material with a chemical-mechanical polish to form a smooth surface over the remaining back of the thinned die.

Figure 1:
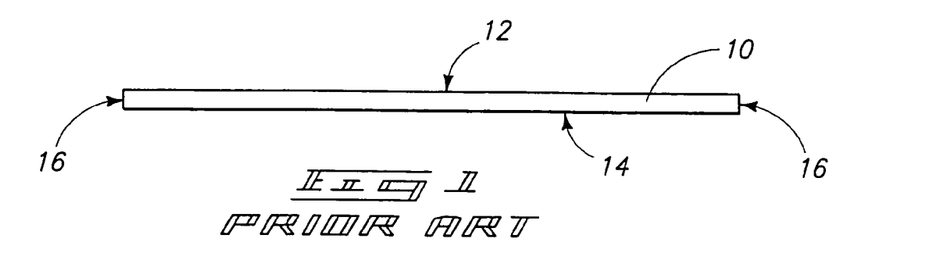
FIG. 1 is a diagrammatic, cross-sectional view of a prior art thin semiconductor construction.

An exemplary thinned semiconductor die 10 is shown in FIG. 1. Such die comprises a front surface 12 and a back surface 14 in opposing relation to the front surface. The front surface would generally support integrated circuitry (not shown). Sidewall surfaces 16 extend from the front surface to the back surface. A thickness of the die (i.e., a length of sidewall surfaces 16) is typically less than 400 microns, frequently less than 100 microns, less than 50 microns, less than 20 microns, or even less than or equal to about 15 microns. Although the die of FIG. 1 is shown flat, it is to be understood that the die can have a more curved configuration, such as, for example, the configuration shown in FIG. 2. Such curved configuration results from tensile and/or compressive forces exerted on and/or within the die. Typically, the die will have a curved configuration. Such is well known to persons of ordinary skill in the art, and integrated circuitry is frequently fabricated to have optimal performance when the die is within a particular curved configuration. If the die is within tolerances of the desired curvature, the die is considered to be within the "sweet spot" for device performance.

The present invention is motivated, in part, to address various problems associated with thin dies. For instance, it is found that performance characteristics of thin dies frequently do not fall within desired tolerances, and accordingly the rejection rates of the dies can be unacceptably high. The poor performance characteristics of the dies can result from the dies having the wrong curvature to fall within the "sweet spot", or can result from other causes. It is desired to improve thin die constructions in order to reduce rejection rates. Although the invention was motivated by particular problems, it is to be understood that the invention is not so limited. Rather, the invention is only limited by the accompanying claims as literally worded, and in accordance with the doctrine of equivalents.

SUMMARY OF THE INVENTION

In one aspect, the invention includes a semiconductor construction comprising a semiconductor material die having a front surface, a back surface in opposing relation to the front surface, and a thickness of less than 400 microns between the front surface and the back surface. Circuitry is associated with the die and over the front surface of the die, and a layer touches the back surface of the die. The layer can comprise, for example, silicon nitride and/or silicon dioxide and/or silicon oxynitride, and can be a stress-inducing layer. The layer can, in some aspects, correspond to a nitrogen-containing material which touches the back surface of the die and also touches at least a portion of a sidewall surface extending from the back surface to the front surface.

In one aspect, the invention includes a method of forming a semiconductor construction. A semiconductor material die is provided, with the die having a thickness in excess of 400 microns. The thickness of the die is reduced to less than 400 microns to form a thin die. The thin die has a front surface for integrated circuitry and a back surface in opposing relation to the front surface. After the thickness of the die is reduced, a getter-inducing structure is formed in direct physical contact with the back surface of the thin die. The getter-inducing structure can comprise, for example, silicon dioxide and/or silicon nitride and/or silicon oxynitride. In particular aspects, the getter-inducing structure can comprise a higher abundance of deuterium than the natural abundance of deuterium.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

One aspect of the present invention is a recognition that the failure of semiconductor constructions comprising thin semiconductor material dies may be caused, at least in part, by ions diffusing interstitially or substitutionally to junction regions and recombining to reduce the minority carrier lifetime. Various ions may be formed during semiconductor processing, including, for example, metallic ions. One approach to reducing damage caused by such ions is to reduce or eliminate the ions during fabrication of semiconductor materials. Accordingly, efforts can be made to complete the fabrication in ultra-clean environments. However, it is difficult in practice to completely eliminate ions from entering at least some semiconductor constructions during a fabrication process. Another approach is to form a gettering region proximate to a semiconductor material die, and/or within the die. The gettering region gathers the various ions and alleviates problems which would otherwise be caused by the ions.

Some gettering regions can be formed along the back surfaces of the dies during the rough polishing utilized to thin the dies. Specifically, the rough polishing can form backside damage regions from cracks extending into the semiconductive material of the dies. Such backside damage regions (which can correspond to crystal defects, such as, for example, dislocations, twin boundaries and stacking faults) can be getters for metallic ions and other ions. However, the chemical-mechanical polishing utilized to smooth the back surfaces can effectively remove the majority of the cracks from the surface (in other words, can polish down through the damage region).

One aspect of the present invention is a recognition that it can be advantageous to provide a getter-inducing layer along, and in some aspects in physical contact with, a back of a semiconductor material die. The getter-inducing layer can itself function as a getter, and/or can induce stress into the backside of the die (such as, for example, crystallographic defects), to form gettering regions within the die. Utilization of the getter-inducing layer can be preferable to attempting to impose additional cleanliness standards beyond those already in place at semiconductor fabrication plants in that a fabricated semiconductor construction is frequently ultimately in contact with ion-containing die attach materials and epoxy molding compounds from which ionic materials can migrate into a semiconductive material die in spite of the best efforts at cleanliness during fabrication of the die.

The getter-inducing layers can comprise one or more compositions which can be formed with relatively low temperature processing (such as, for example, processing temperatures of less than 300° C.). The low temperature formation of the getter-inducing layers on the back surface can be particularly advantageous if temperature-sensitive materials are present in structures on the front surface of the semiconductor material die. For instance, various alloys utilized in semiconductor integrated circuit structures will have melting temperatures of about 400° C. If such alloys are incorporated into structures on the front surface of the semiconductive material die, it is preferred that the processing temperatures utilized to form the getter-inducing material on the back surface of the die be less than the melting temperatures of the alloys, which can impose an upper temperature limit of less than 400° C., less than 350° C., or even less than 300° C. Further, there will frequently be a polyimide material formed on the front of the semiconductor material die, and such can limit processing temperatures utilized in forming the getter-inducing material to less than 400° C., and frequently to less than 300° C. Additionally, other materials utilized on the front surface of the semiconductive material die may limit preferred processing temperatures utilized to form the getter-inducing material on the back surface to less than 250° C. in some applications.

The getter-inducing material will preferably be suitable gettering the typical problematic ions of sodium, potassium, aluminum, copper and other metal ions. It can also be preferred that the getter-inducing material be suitable for being provided in a wafer level process for high throughput, and it can be desired that a clean room fabrication process be utilized to control impurities during formation of the getter-inducing material over the back surface of the semiconductive material die. It can also be preferred that the getter-inducing material possess good adhesion to the back surface of the semiconductor die.

Any of several materials can be formed on the back surface of a die and utilized as getter-inducing materials in various aspects of the invention. One material that can be particularly useful is a low temperature deuterium nitride ($Si_xN_y$:D, where x and y are numbers are greater than 0 and where the D indicates incorporation of deuterium into the nitride film, or, in other words, where D indicates that the ratio of deuterium to any hydrogen present in the $Si_xN_y$ is greater than the natural abundance of deuterium). The deuterium nitride can be formed by any suitable method, and in some aspects can be deposited by plasma enhanced chemical vapor deposition (PECVD). The PECVD can enable formation of a film having good integrity under low temperature conditions. The silicon nitride film can be formed using, for example, one or more of $SiD_4$, $ND_3$, $N_2$, $SiH_4$, $NH_3$ and $H_2$ at a process temperature range of from about 150° C. to about 300° C. The thickness of the film can be any suitable thickness, and in some aspects will be from about 50 Å to about 5 microns.

Another material that can be useful as a getter-inducing material on the backside of a die is silicon dioxide. The silicon dioxide can be either enriched in deuterium (i.e., $Si_xO_y$:D, where x and y are numbers greater than 0) or not (i.e., $Si_xO_y$:H).

Another material that can be useful as a getter-inducing material on the backside of a die is silicon oxynitride. The silicon oxynitride can be either enriched in deuterium (i.e., $Si_xN_yO_z$:D, where x, y and z are numbers greater than 0) or not (i.e., $Si_xN_yO_z$:H).

Although the materials formed over the back surfaces of semiconductive material dies in accordance with various aspects of the present invention can be utilized as getter-inducing materials, they can also be utilized for other applications either in addition to, or alternatively to, utilization as getter-inducing materials in various aspects of the invention. For instance, the materials formed over the back surface of a semiconductor material wafer die can be utilized for passivation of dangling bonds or other defects of the semiconductor material die, and/or can be utilized as moisture barrier materials, and/or can be utilized as ion barrier materials (such as, for example, sodium barrier materials or potassium barrier materials).

Gettering materials have been utilized for semiconductive material substrates in the past. However, the gettering materials have not been provided over back surfaces of thin semiconductive material dies (i.e., dies having a thickness of less than 400 microns). To the extent that gettering materials have been provided over back surfaces of dies which are ultimately to be utilized in forming thin dies, the gettering materials have been removed during the thinning of the die and not replaced. There are numerous reasons why gettering materials are removed during polishing of the back surfaces of semiconductor material wafer dies and not replaced, including, for example, ease of manufacturing (i.e., to reduce manufacturing steps). However, one aspect of the present invention is recognition that the advantages of forming gettering regions along the back surface of a semiconductive material die can outweigh the disadvantages imposed by the additional fabrication complexities incurred in forming getter-inducing materials on the back surface.

Among the advantages that the getter regions of the present invention offer are that such can improve yield margin during fabrication of semiconductor constructions. Additionally, the getter regions can improve the robustness of a semiconductor construction which can improve the reliability of the construction once it is incorporated into a package. In fact, the improved robustness of the construction may enable the construction to be utilized in packages in which other materials have lower tolerances than are presently utilized. For instance, the levels of ions or moisture in the epoxy utilized in packaging may be able to increase when getter-inducing layers of the present invention are utilized in that a layer along the back surface of the die can function as a protective barrier between the die and the epoxy. Such protective barrier can prevent moisture and/or ions from migrating from the epoxy to the semiconductive material die. Additionally, if nitride is utilized in the layer formed along the back surface, oxide surface termination processes which have been utilized in the past can potentially be eliminated since the nitride will typically have good adhesion to polymeric materials. Further, the getter-inducing layers of the present invention can be provided along edges of a semiconductive material die as well as along the back surface, which can further help to alleviate and, in some aspects, prevent, ion diffusion into the semiconductor material die.

One advantage to utilizing a getter region along the back surface of a thin die is that the getter region will be very close to the junctions associated with the front surfaces of the die. Diffusion theory suggests that the closer a getter region is to an active region, the more productive the gettering effect will be. Getter regions along the back surfaces of very thin dies can be within 10 to 15 microns of junctions which can allow the getter regions to have significant gettering effects.

Any suitable material, including, but not limited to the exemplary materials discussed above (i.e., silicon dioxide, silicon nitride and silicon oxynitride) can be utilized alone, or in combination with other materials, as layers along back surfaces of semiconductive material dies in various aspects of the invention. For instance, various oxides (such as silicon dioxide, which includes doped silicon dioxide, such as, for example, phosphosilicate glass) can be utilized along the back surfaces either alone, or in conjunction with silicon layers and/or silicon nitride layers. For instance, a layer of silicon dioxide can be formed along the back surface and a layer of silicon can be formed over the layer of silicon dioxide. In other aspects, the layer of silicon dioxide can be formed along the back surface and a layer of silicon nitride subsequently formed on the silicon dioxide so that the getter-inducing construction comprises the combined layers of silicon dioxide and silicon nitride.

If oxides are utilized, it may be advantageous to utilize thicker layers than those discussed above for utilization when nitride is the primary composition. For instance, oxide-containing layers along the back surface of a semiconductor die can preferably have thicknesses of greater than 60 nanometers. In exemplary aspects in which phosphosilicate glass (PSG) is utilized as a layer along a back surface of a semiconductor die, such can be formed by spin-coating the material onto the surface and subsequently annealing the material at a temperature of less than or equal to about 300° C.

Various specific aspects of the invention are described below with reference to FIGS. 3–11.

Figure 3:
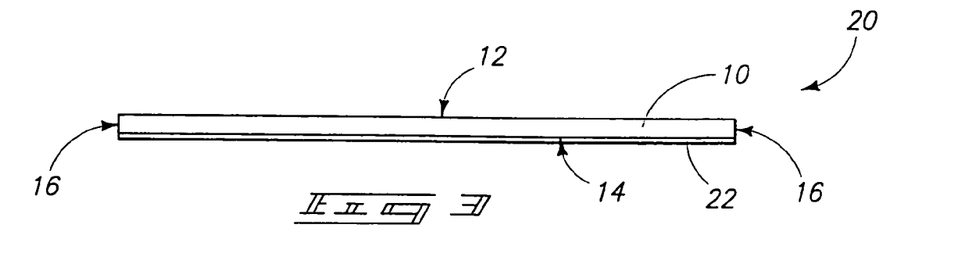
FIG. 3 is a diagrammatic, cross-sectional view of a semiconductor construction in accordance with an exemplary aspect of the present invention.

Referring initially to FIG. 3, an aspect of the invention is described with reference to a semiconductor construction 20. In referring to construction 20, similar numbering will be used as was used above in describing the constructions of the prior art. Accordingly, construction 20 is shown to comprise a semiconductive material die 10 having a front surface 12 and a back surface 14, and further having sidewall surfaces 16 extending between the front and back surfaces. Integrated circuitry (not shown) will be associated with front surface 12 as discussed previously with reference to the prior art.

Semiconductor material die 10 is a thin die in the construction of FIG. 3, and accordingly has a thickness from back surface 14 to front surface 12 of less than 400 microns, and in some aspects less than 100 microns, less than 50 microns, less than 20 microns, or even less than or equal to about 15 microns.

Figure 2:
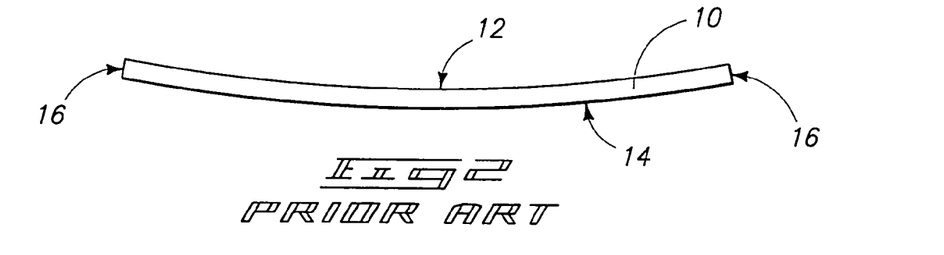
FIG. 2 is a diagrammatic, cross-sectional view of a prior art thin semiconductor construction showing curvature which can exist within the construction.

In contrast to the prior art of FIGS. 1 and 2, construction 20 of FIG. 3 comprises a layer 22 extending along at least some of back surface 14. In the shown aspect, layer 22 extends across an entirety of back surface 14. Layer 22 is shown in direct physical contact with (i.e., is shown touching) back surface 14. In particular aspects, layer 22 can be a stress-inducing layer which forms a gettering region proximate back surface 14 of semiconductive material die 10. The gettering region can be within stressed regions of semiconductor material die 10 proximate the interface of layer 22 with back surface 14 and/or can be within layer 22. Regardless, layer 22 can be referred to as getter-inducing layer (in that the layer induces gettering to occur which would not occur in the absence of the layer) or as an external gettering structure (in that the layer is external of semiconductor material die 10 and provides gettering regions to gather species that would otherwise diffuse within semiconductor material die 10).

Layer 22 can comprise any suitable composition. In some aspects, layer 22 will comprise silicon and oxygen. In such aspects the layer can, for example, comprise, consist essentially of, or consist of, silicon dioxide. In other aspects, layer 22 will comprise silicon and nitrogen. In particular aspects, layer 22 can consist essentially of or consist of silicon, nitrogen and one or more hydrogen isotopes. The hydrogen isotopes can contain a natural abundance of deuterium, or in some aspects can contain a greater than natural abundance of deuterium. The layer 22 can thus comprise normal silicon nitride (i.e., silicon nitride having a natural abundance of deuterium relative to other hydrogen isotopes), or can comprise the deuterium nitride discussed previously in this disclosure.

The above-discussed compositions for layer 22 are exemplary compositions, and layer 22 can comprise numerous other compositions suitable for inducing stress along back surface 14. Such other compositions can include, for example, various glasses, such as PSG.

Layer 22 can have any suitable thickness. If layer 22 comprises silicon nitride, the thickness of layer 22 can be, for example, from about 50 Å to about 5 microns.

Figure 4:
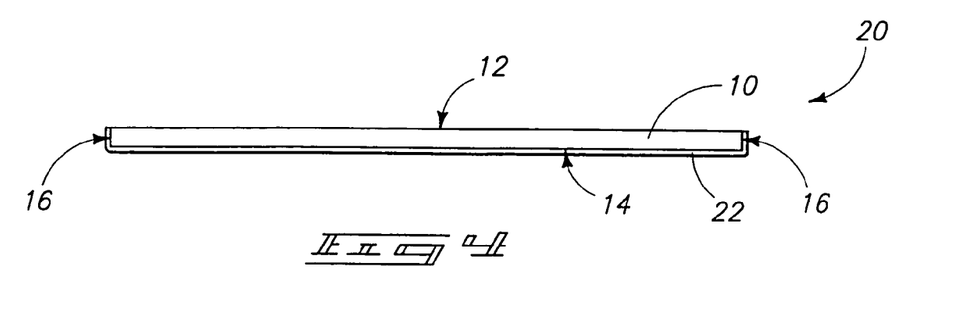
FIG. 4 is a diagrammatic, cross-sectional view of a semiconductor construction illustrating an aspect alternative to that of FIG. 3

Although layer 22 is shown extending only along the back surface 14 in FIG. 3, it is to be understood that layer 22 can also extend along the sidewall surfaces 16. Such aspect of the invention is shown in FIG. 4. The numbering in FIG. 4 is identical to that of FIG. 3. Accordingly, FIG. 4 shows a construction 20 in which layer 22 extends along a back surface 14 of a die 10 and also along sidewall surfaces 16 of the die. The layer 22 can extend along an entirety of the sidewall surfaces 16 (i.e., can extend along the full length of the sidewall surfaces), or can extend along only a portion of the sidewall surfaces. For instance, the layer 22 can physically contact (i.e. touch) at least 25% of the length of the sidewall surfaces, at least 50% of the length of the sidewall surfaces, or at least 75% of the length of the sidewall surfaces in various aspects of the invention.

Although material 22 is shown having a constant thickness along the surface 14 as well as along the sidewall surfaces 16, it is to be understood that the thickness of layer 22 can vary. For instance, layer 22 can thin along the sidewalls relative to the portion of layer 22 along the back surface. In exemplary applications semiconductor material die 16 will have rounded sidewall edges rather than the shown substantially vertical edges. In such aspects, the layer 22 may thin as it curves around the rounded sidewall edges, rather than having the shown constant thickness along the edges.

Figure 5:
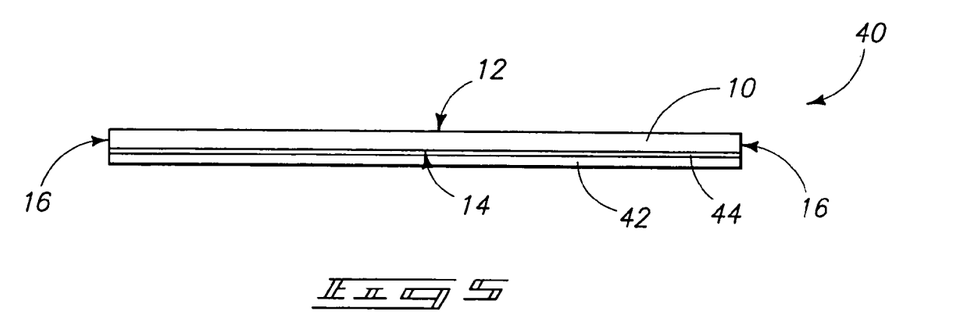
FIG. 5 is a diagrammatic, cross-sectional view of a semiconductor construction of the present invention illustrating another aspect of the invention.

FIGS. 3 and 4 illustrate aspects in which a single layer is formed along back surface 14 of a semiconductor material die. The invention also encompasses aspects in which multiple layers are formed to produce a stress-inducing material. Such aspect is shown in FIG. 5. In referring to FIG. 5, similar numbering will be used as was used above in describing FIGS. 3 and 4, where appropriate.

FIG. 5 shows a construction 40 comprising the semiconductive material die 10 described previously. Die 10 comprises the front surface 12, back surface 14 and sidewall surfaces 16 discussed above. Construction 40 further comprises a pair of layers 42 and 44 along back surface 14. Although only two layers are shown in the construction of FIG. 5, it is to be understood that more than two layers can also be formed in various aspects of the invention.

The layer 44 is between layer 42 and back surface 14. Layer 44 can be utilized for modifying stress relative to the stress that would be induced if layer 42 were formed directly against surface 14. For instance, if layer 42 comprises, consists essentially of, or consists of a nitrogen-containing material (such as, for example, silicon nitride or another nitride); layer 44 can comprise, consist essentially of, or consist of an oxygen-containing material (such as, for example, silicon dioxide, silicon oxynitride or another oxide). A silicon dioxide layer 44 can function as a pad to alleviate stress so that the stress is less than that which would occur if a nitride-containing layer 42 were directly against surface 14. Such can allow the amount of stress induced by a stress-inducing construction comprising the combined layers 42 and 44 to be modified by the composition of the layers and/or by the thicknesses of the layers relative to one another.

Layers 42 and 44 can comprise any suitable compositions. In some aspects, the layers 42 and 44 will comprise, consist essentially of, or consist of silicon nitride and silicon dioxide, respectively, as discussed above. In other aspects, one of layers 42 and 44 will comprise, consist essentially of, or consist of silicon and the other will comprise, consist essentially of, or consist of silicon dioxide. For instance, interior layer 44 can consist essentially of or consist of silicon dioxide and exterior layer 42 can consist essentially of consist of silicon in some aspects of the invention.

As discussed previously, it can be advantageous in some aspects of the invention if a layer formed proximate a back surface of a semiconductor material die comprises deuterium. For instance, the layer 22 of FIG. 3, or the layer 22 of FIG. 4, or the layer 42 of FIG. 5 can be a deuterium-containing layer, and can be considered to be formed along the back surface 14 of the die 10. In particular aspects, the deuterium-containing layer will comprise, consist essentially of, or consist of $Si_xN_y$:D, where x and y are numbers greater than 0, and where the D indicates that the ratio of deuterium to any hydrogen present in the $Si_xN_y$ is greater than the natural abundance of deuterium. FIGS. 3 and 4 show that the deuterium-containing layer can touch the back surface 14 of the die 10, and FIG. 5 shows that the deuterium-containing layer can be separated from the back surface by an intervening layer (shown as layer 44). In particular aspects, such intervening layer can comprise, consist essentially of, or consist of silicon dioxide. An advantage of utilizing a deuterium-containing material along the back surface 14 of the die is that such can allow better passivation of structures associated with the die than can a material comprising less deuterium, as will be discussed below with reference to FIG. 10.

The constructions of FIGS. 1–4 can be incorporated into various electronic devices, including, for example, various mobile devices, such as, for example, telephones, cameras, personal calendars, etc.

FIGS. 6–9 illustrate an exemplary method for forming a construction of the present invention. In referring to FIGS. 6–9, similar numbering will be used as was used above in describing FIG. 3, where appropriate.

Figure 6:
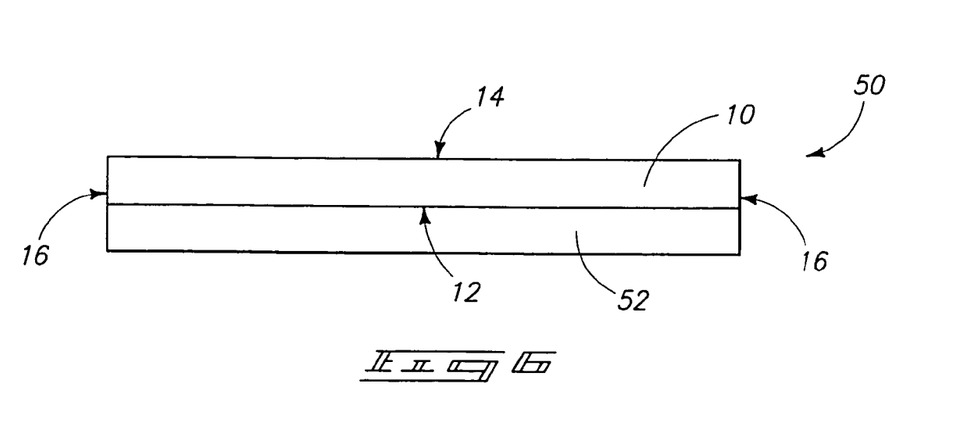
FIG. 6 is a diagrammatic, cross-sectional view of a semiconductor construction at a preliminary processing stage of an exemplary processing aspect of the present invention.

FIG. 6 shows a construction 50 comprising the semiconductive material die 10 described previously. Such die comprises a front surface 12, back surface 14 and side surface 16. Notably, the front surface 12 and back surface 14 are inverted in FIG. 6 relative to FIG. 3. Front surface 12 may have some integrated circuitry formed thereover at the processing stage of FIG. 6, may have all of the integrated circuitry formed thereover which will ultimately be formed over the surface, or may have no integrated circuitry formed thereover. The die is not yet a thin die, and accordingly back surface 14 is much further from front surface 12 in the die of FIG. 6 than in the die of FIG. 3. In other words, the distance between front surface 12 and back surface 14 in the die 10 of FIG. 6 is more than 400 microns.

Front surface 12 is adhered to a support structure 52. Support structure 52 can comprise any suitable material, including, for example, quartz, glass or silicon. In particular aspects, structure 52 will be predominately (i.e. will comprise more than 50% by volume) quartz, glass or silicon, and in some aspects will consist essentially of or consist of quartz, glass or silicon. Front surface 12 can be adhered to support structure 52 through any suitable methodology, including, for example, utilization of a readily-removable adhesive. Support structure 52 can improve handling of semiconductor material die 10 during the thinning of the die and subsequent formation of a layer over a back surface of the die.

Figure 7:
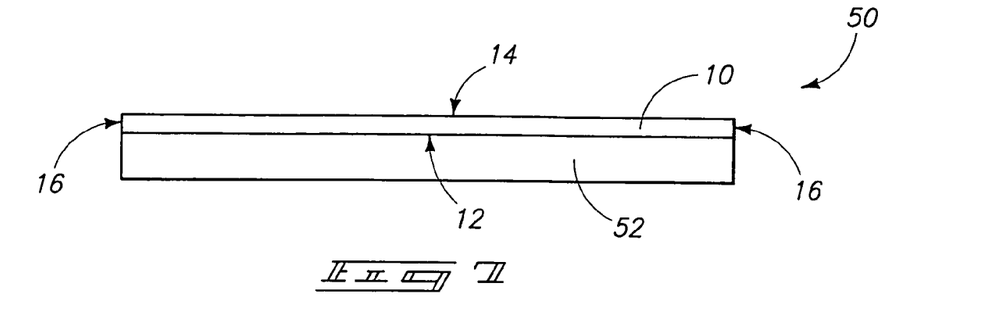
FIG. 7 is a view of the FIG. 6 construction shown at a processing stage subsequent to that of FIG. 6.

Referring next to FIG. 7, construction 50 is illustrated after die 10 has been subjected to suitable processing to thin the die. Accordingly, back surface 14 is now much closer to front surface 12 than it had been at the processing stage of FIG. 6. Die 10 is preferably thinned so that a thickness of the die is now less than 400 microns, in some aspects less than 100 microns, less than 50 microns, less than 20 microns, or even less than or equal to 15 microns. The thinning of die 10 can be accomplished by conventional methods, including, for example, rough polishing followed by chemical-mechanical planarization.

Back surface 14 is exposed at the processing stage of FIG. 7. If the semiconductor material of wafer 10 comprises silicon, a thin layer of silicon dioxide (so-called native oxide) can form over back surface 14. Such layer can be removed by, for example, a hydrofluoric acid (HF) dip, if so desired, or such layer can be left over surface 14 in other aspects of the invention.

Figure 8:
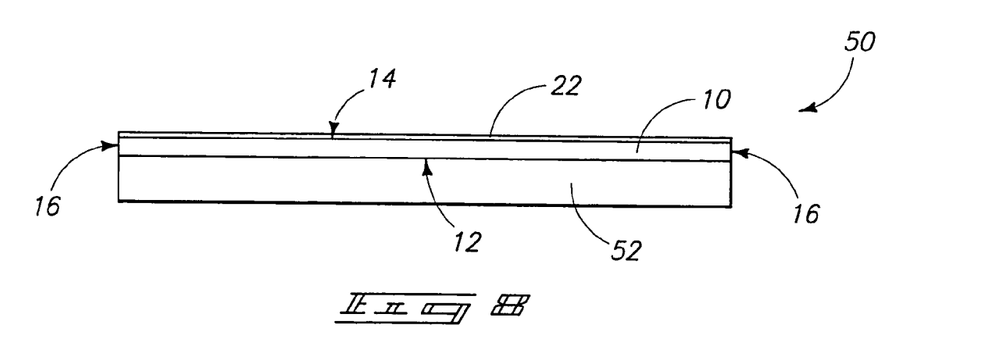
FIG. 8 is a view of the FIG. 6 construction shown at a processing stage subsequent to that of FIG. 7.

Referring to FIG. 8, a layer 22 is formed over back surface 14 of die 10. Layer 22 can comprise any of the compositions discussed above with reference to FIG. 3. Although the aspect of FIG. 8 is shown forming the single layer 22 in physical contact with back surface 14, it is to be understood that the invention encompasses other aspects in which the multiple layers of FIG. 5 (layers 42 and 44) are formed over back surface 14 at the processing stage of FIG. 8. Die 10 remains adhered to support structure 52 during formation of the layer over back surface 14. Such simplifies handling of the die relative to the handling in the absence of structure 52. However, it is to be understood that the invention encompasses other aspects (not shown) in which the layer is formed over the back surface without the die being adhered to a support structure.

Figure 9:
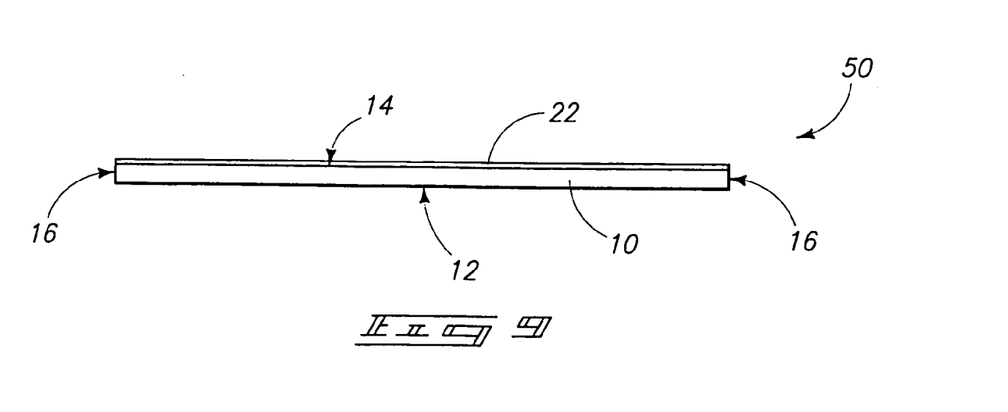
FIG. 9 is a view of a portion of the FIG. 8 construction shown at a processing stage subsequent to that of FIG. 8.

Referring next to FIG. 9, structure 50 is shown after removal of support structure 52 (FIG. 8). Accordingly, the remaining structure comprises die 10 with layer 22 formed thereover, identical to the structure discussed above with reference to FIG. 3. It is to be understood that any of the structures of FIGS. 3–5 can be formed with processing analogous to that discussed with reference to FIGS. 6–9. It is also to be understood that some or all of the integrated circuitry that is ultimately to be formed over front surface 12 can be formed after removal of the die from supporting structure 52 in some aspects of the invention.

The layers formed along the back surfaces of a semiconductor die in accordance with various aspects of the invention can provide numerous advantages as discussed previously. For instance, the layers can be utilized to induce getter and/or to adjust stresses along the back surface (to adjust the relative compressive and tensile stresses) so that the die is within the desired "sweet spot" for device performance. Also, the layers can provide passivation and/or barrier qualities.

Figure 10:
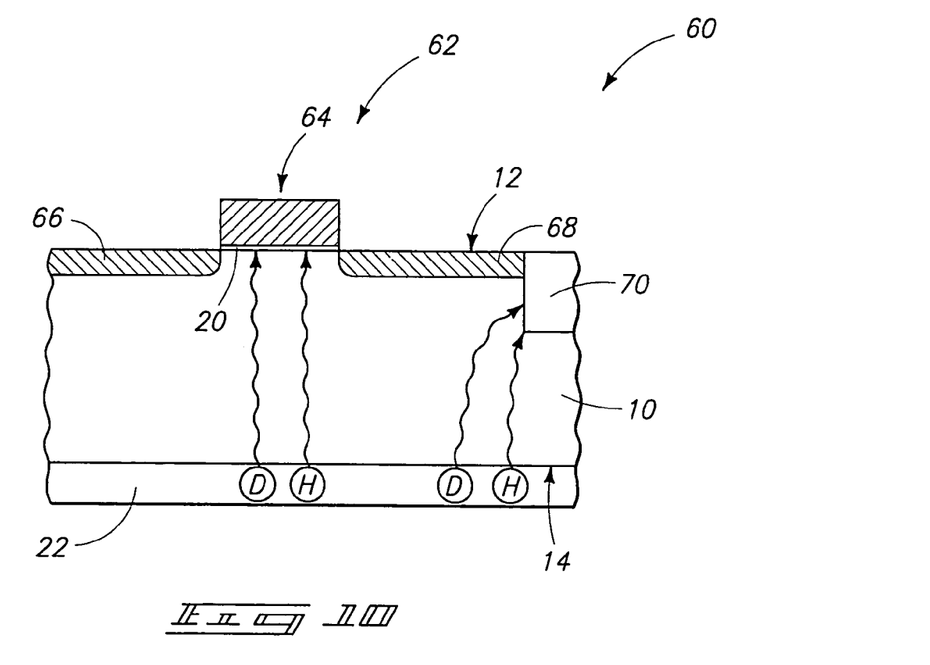
FIG. 10 is a diagrammatic, cross-sectional view of a fragment of a semiconductor construction illustrating an exemplary passivating aspect that can be obtained in some embodiments of the present invention.

FIG. 10 shows a construction 60 illustrating how a layer of the present invention can provide passivation. In referring to construction 60, similar numbering will be used as was utilized above in describing FIG. 3.

Construction 60 comprises a die 10 having a front surface 12 and a back surface 14, and further comprises a layer 22 along back surface 14. The die is shown in expanded view in FIG. 60 so that an integrated circuit device 62 associated with the front surface can be diagrammatically illustrated. Device 62 corresponds to a conventional transistor device. Accordingly, device 62 comprises a gate 64 and source/drain regions 66 and 68 proximate the gate. The gate is separated from an upper surface of die 10 by a dielectric material 20. Dielectric material 20 can comprise any suitable composition, including, for example, silicon dioxide. Gate 64 can comprise any suitable composition, including, for example, various layers of conductive material, such as, for example, metals, metal compounds, conductively-doped silicon, etc. Source/drain regions 66 and 68 correspond to diffusion regions within semiconductive material of die 10 where conductivity-enhancing dopant has been provided. The dopant can be either n-type or p-type, as is known to persons of ordinary skill in the art. Construction 60 is further shown to comprise an isolation region 70 proximate one of the source/drain regions. The isolation region can correspond to a so-called shallow trench isolation region, and can be filled with any suitable electrically insulative material, including, for example, silicon dioxide.

One of the problems that can be associated with the construction 60 is that there may be so-called dangling bonds at the outer surface 12 of die 10. Such dangling bonds can impair device performance. If layer 22 comprises hydrogen isotopes (either hydrogen itself or deuterium, for example) the hydrogen isotopes can migrate through die 10 to passivate the dangling bonds and thereby improve device performance. Deuterium can be preferred over hydrogen, in that deuterium frequently will better passivate semiconductor materials than does hydrogen. Accordingly, it can be desired to have a greater ratio of deuterium to hydrogen in layer 22 than the natural abundance of deuterium. This includes aspects in which there is a concentration of hydrogen in layer 22 that is approximately zero.

Figure 11:
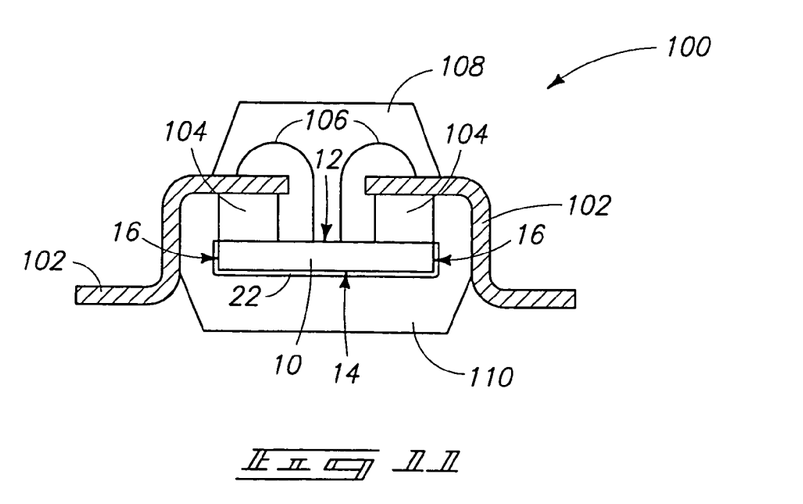
FIG. 11 is a diagrammatic, cross-sectional view of a semiconductor package illustrating an exemplary aspect of the present invention.

As discussed previously, a layer formed along the back surface of a die in accordance with aspects of the present invention can provide barrier properties. FIG. 11 illustrates a semiconductor package 100 having such layer.

The semiconductor package 100 of FIG. 11 comprises a die 10 of the type described previously with reference to FIG. 4. Such die comprises a front surface 12, a back surface 14, sidewall surfaces 16, and a layer 22 extending along the back surface and also along the sidewall surfaces 16. The package further comprises a support structure 102 to which die 10 is adhered through retaining structures 104. The retaining structures 104 can correspond to, for example, tape, glue, etc. Wires 106 extend from front surface 12 of the die to support structure 102, so that integrated circuitry associated with the front surface of the die can be connected to devices external of package 100.

The package 100 comprises a first encapsulant 108 extending along the front surface, and a second encapsulant 110 extending along the layer 22. First encapsulant 108 can be a relatively expensive low-moisture and low ionic material encapsulant, in that the encapsulant is not spaced from die 10 by any intervening material. In contrast, second encapsulant 110 can be a cheaper encapsulant, in that the encapsulant is spaced from die 10 by intervening layer 16. The layer 16 can function as a barrier to prevent moisture from entering die 10 from encapsulant 110, and also to prevent ionic materials from diffusing from encapsulant 110 into die 10. In other aspects, encapsulant 110 can comprise an expensive low moisture and low ionic content material, and barrier 16 can still alleviate problems which would otherwise occur from moisture diffusion and/or ionic diffusion from the encapsulant, in that even the highly expensive encapsulants frequently have some level of moisture and/or ionic contaminants therein. Typical encapsulants are epoxies, and it is very difficult to obtain epoxies that don't have potentially problematic levels of moisture therein. In the shown aspect of the invention, encapsulant 110 is in direct physical contact (i.e. touches) layer 22.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. A method of forming a semiconductor construction, comprising:
   providing a semiconductive material die having a thickness in excess of 400 microns;
   reducing the thickness of the die to less than 400 microns to form a thin die, the thin die having a front surface for integrated circuitry and a back surface in opposing relation to the front surface;
   after reducing the thickness of the die, forming a getter-inducing structure in direct physical contact with the back surface of the thin die; and
   wherein the reducing the thickness of the die comprises:
      adhering the front surface to a support structure; and
      while the front surface is adhered to the support structure, subjecting the back surface to one or both of polishing and etching.

2. The method of claim 1 wherein the support structure is predominantly quartz, glass or silicon.

3. A method of forming a semiconductor construction, comprising:
   providing a semiconductive material die having a thickness in excess of 400 microns;
   reducing the thickness of the die to less than 400 microns to form a thin die, the thin die having a front surface for integrated circuitry and a back surface in opposing relation to the front surface; and
   after reducing the thickness of the die, forming a getter-inducing structure in direct physical contact with the back surface of the thin die; wherein the getter-inducing structure comprises silicon dioxide formed to a thickness of at least about 60 nanometers.

4. A method of forming a semiconductor construction, comprising:
   providing a semiconductive material die having a thickness in excess of 400 microns;
   reducing the thickness of the die to less than 400 microns to form a thin die, the thin die having a front surface for integrated circuitry and a back surface in opposing relation to the front surface; and
   after reducing the thickness of the die, forming a getter-inducing structure in direct physical contact with the back surface of the thin die; wherein the getter-inducing structure comprises a layer containing silicon and nitrogen; wherein said layer is in direct physical contact with the back surface; and wherein said layer consists essentially of silicon, nitrogen and one or more hydrogen isotopes.

5. The method of claim 4 wherein the one or more hydrogen isotopes contain a greater than natural abundance of deuterium.

6. The method of claim 4 wherein said layer consists of the silicon, nitrogen and one or more hydrogen isotopes.

7. The method of claim 6 wherein the one or more hydrogen isotopes contain a greater than natural abundance of deuterium.

8. A method of forming a semiconductor construction, comprising:
   providing a semiconductive material die having a thickness in excess of 400 microns;
   reducing the thickness of the die to less than 400 microns to form a thin die, the thin die having a front surface for integrated circuitry and a back surface in opposing relation to the front surface; and
   after reducing the thickness of the die, forming a getter-inducing structure in direct physical contact with the back surface of the thin die; wherein the getter-inducing structure comprises a layer containing silicon and nitrogen; wherein said layer is not in direct physical contact with the back surface; and wherein said layer consists essentially of silicon, nitrogen and one or more hydrogen isotopes.

9. The method of claim 8 wherein the one or more hydrogen isotopes contain a greater than natural abundance of deuterium.

10. The method of claim 9 wherein the said layer has a thickness of from about 50 Å to about 5 microns.

11. The method of claim 8 wherein said layer consists of the silicon, nitrogen and one or more hydrogen isotopes.

12. The method of claim 8 wherein said layer is spaced from the back surface by silicon dioxide.

13. A method of forming a semiconductor construction, comprising:
   providing a semiconductive material die having a thickness in excess of 400 microns;
   reducing the thickness of the die to less than 400 microns to form a thin die, the thin die having a front surface for integrated circuitry and a back surface in opposing relation to the front surface;
   after reducing the thickness of the die, forming a getter-inducing structure in direct physical contact with the back surface of the thin die; and
   wherein the getter-inducing structure is formed while exposing the die to a maximum processing temperature of less than or equal to 350° C.

14. The method of claim 13 wherein the maximum processing temperature is less than or equal to 300° C.

15. The method of claim 13 wherein the maximum processing temperature is less than or equal to 250° C.

16. A method of forming a semiconductor construction, comprising:
- providing a semiconductive material die having a thickness in excess of 400 microns;
- reducing the thickness of the die to less than 400 microns to form a thin die, the thin die having a front surface for integrated circuitry and a back surface in opposing relation to the front surface;
- after reducing the thickness of the die, forming a getter-inducing structure in direct physical contact with the back surface of the thin die; and
- after forming the getter-inducing structure, incorporating the die into a semiconductor package, the incorporating including providing an epoxy in direct physical contact with at least a portion of the getter-inducing structure.

17. A method of forming a semiconductor construction, comprising:
- providing a semiconductive material die having a thickness in excess of 400 microns;
- reducing the thickness of the die to less than 400 microns to form a thin die, the thin die having a front surface for integrated circuitry and a back surface in opposing relation to the front surface;
- after reducing the thickness of the die, forming a getter-inducing structure in direct physical contact with the back surface of the thin die; and
- wherein the getter-inducing structure comprises a layer of deuterium-enriched silicon oxynitride.

* * * * *

UNITED STATES PATENT AND TRADEMARK OFFICE
CERTIFICATE OF CORRECTION

PATENT NO. : 7,037,808 B2
APPLICATION NO. : 11/197151
DATED : May 2, 2006
INVENTOR(S) : Tongbi Jiang

It is certified that error appears in the above-identified patent and that said Letters Patent is hereby corrected as shown below:

Col. 4, line 57 –
    Replace "($Si_xN_y$:D, where x and y are numbers are greater than 0 and"
    Insert --($Si_xN_y$:D, where x and y are numbers greater than 0 and--

Col. 8, line 33 –
    Replace "of consist of silicon in some aspects of the invention."
    Insert --of silicon in some aspects of the invention.--

Signed and Sealed this

Twenty-seventh Day of March, 2007

JON W. DUDAS
*Director of the United States Patent and Trademark Office*